(12) United States Patent
Mitsuoka et al.

(10) Patent No.: US 7,348,129 B2
(45) Date of Patent: Mar. 25, 2008

(54) ELECTRON BEAM PROCESSING METHOD AND APPARATUS

(75) Inventors: Kazuyuki Mitsuoka, Nirasaki (JP); Minoru Honda, Nirasaki (JP); Song Yun Kang, Nirasaki (JP); Yusuke Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 716 days.

(21) Appl. No.: 10/810,633

(22) Filed: Mar. 29, 2004

(65) Prior Publication Data

US 2004/0248040 A1    Dec. 9, 2004

(30) Foreign Application Priority Data

Mar. 28, 2003   (JP) .............................. 2003-091878

(51) Int. Cl.
*G03C 5/00*    (2006.01)
*A61N 5/00*    (2006.01)

(52) U.S. Cl. ....................... 430/296; 430/942; 427/551; 427/595; 250/492.2; 250/492.3

(58) Field of Classification Search ................ 430/296, 430/942; 427/551, 595; 250/492.2, 492.3
See application file for complete search history.

(56) References Cited

U.S. PATENT DOCUMENTS 6,607,991 B1 *    8/2003    Livesay et al. ............. 438/787

FOREIGN PATENT DOCUMENTS

| JP | 2001-143983 | 5/2001 |
|---|---|---|
| KR | 2002-0063923 | 8/2002 |
| WO | WO 01/48805 | 7/2001 |

* cited by examiner

*Primary Examiner*—Christopher G. Young
(74) *Attorney, Agent, or Firm*—Oblon, Spivak, McClelland, Maier & Neustadt, P.C.

(57) ABSTRACT

An organic material film formed on a surface of an object to be processed is cured by electron beams irradiated thereon through a hydrocarbon radical generating gas. By employing the electron beams and the hydrocarbon radical generating gas, a deterioration of a k value of the organic material film and a reduction of a chemical resistance thereof are suppressed.

10 Claims, 4 Drawing Sheets

ELECTRON BEAM PROCESSING METHOD AND APPARATUS

FIELD OF THE INVENTION

The present invention relates to an electron beam processing method and apparatus for reforming an organic material film such as an interlayer insulating film by employing electron beams.

BACKGROUND OF THE INVENTION

With the development of high integration and high speed semiconductor devices, wiring structure thereof is becoming finer and reduction of electrical capacitance between wirings is getting more and more important. To meet such technical requirements, an organic material of a low dielectric constant has been developed as a low-k film material for use in forming an interlayer insulating film. Since, however, the low-k film material dose not have sufficient mechanical strength required as the interlayer insulating film, there have been recently suggested various methods for enhancing the mechanical strength of the organic material film by using electron beams. For example, disclosed in Japanese Patent Laid-open Publication No. 2000-221699 (paragraphs [0015], [0016] and [0020]) is a curing method for improving a film quality of an organic material film such as a resist film or an antireflection film by facilitating a carbonization reaction by way of irradiating electron beams thereto in oxidizing or reducing atmosphere. Further, U.S. Pat. No. 6,652,922 discloses another curing method for hardening an organic material by way of irradiating electron beams thereto in the presence of oxygen ($O_2$), argon (Ar), nitrogen ($N_2$), helium (He) or a combination thereof, thereby improving a heat resistance or a plasma resistance of the organic material film of a low dielectric constant.

Though such curing methods serve to improve mechanical strength of the organic material film by hardening a surface region thereof through the use of electron beams, there remain certain problems in that the k value at the surface region of the organic material film may be deteriorated or methyl groups may be decomposed, to thereby reduce a chemical resistance thereof during a cleaning process, for example.

SUMMARY OF THE INVENTION

It is, therefore, an object of the present invention to provide an electron beam processing method and an apparatus capable of suppressing a deterioration of k value of an insulating film and a reduction of chemical resistance thereof.

In accordance with one aspect of the present invention, there is provided an electron beam processing method for processing an organic material film formed on a surface of an object to be processed by using an electron beam, wherein the electron beam is irradiated onto the organic material film through a hydrocarbon radical generating gas.

In accordance with another aspect of the present invention, there is provided an electron beam processing apparatus including: a hermetically structured processing chamber; a mounting table disposed inside the processing chamber for mounting thereon an object to be processed having an organic material film formed on a surface thereof; a plurality of electron beam tubes disposed above the mounting table; a gas supply unit for supplying a hydrocarbon radical generating gas into the processing chamber; and a depressurization unit for reducing an inner pressure of the processing chamber, wherein the electron beam tubes irradiate electron beams onto the organic material film through the hydrocarbon radical generating gas.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments of the present invention will now be described with reference to FIGS. 1 to 5B.

Figure 1:
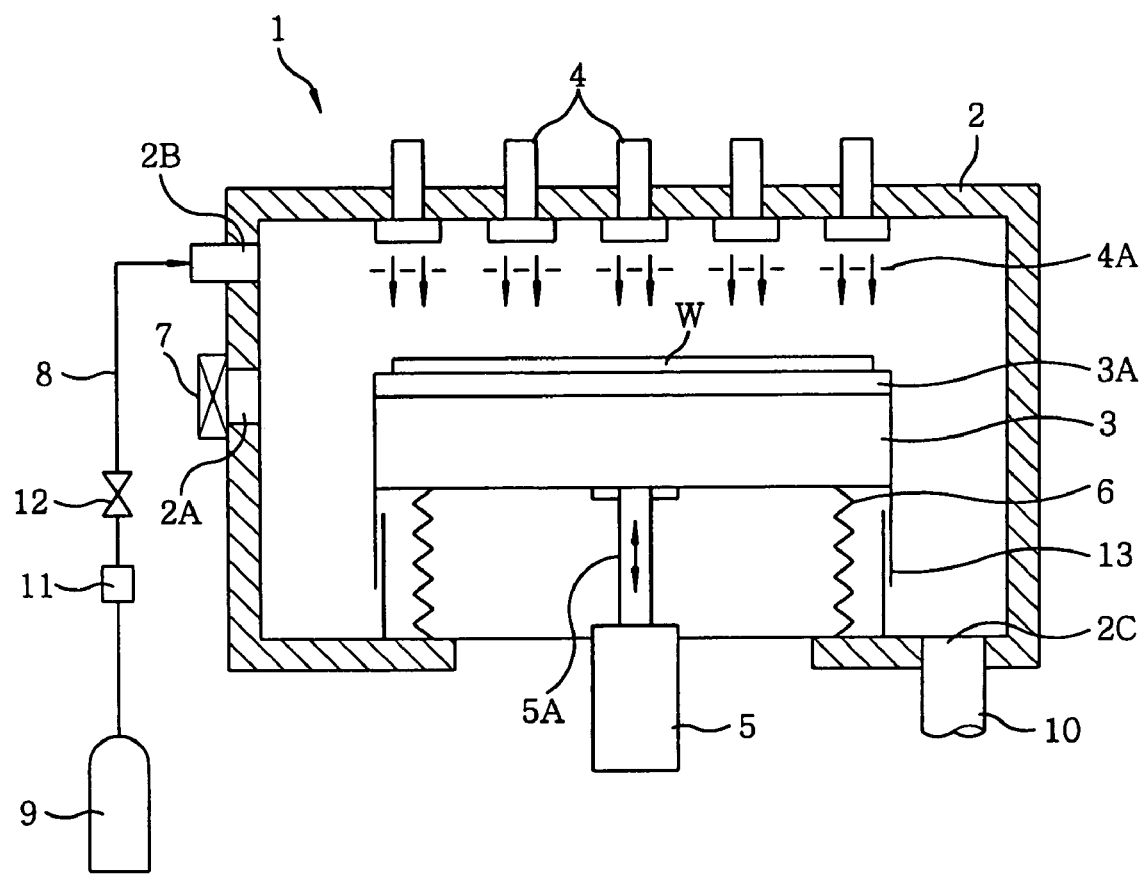
FIG. 1 shows an electron beam processing apparatus in accordance with a preferred embodiment of the present invention.

An electron beam processing apparatus 1 of a preferred embodiment of the present invention includes, e.g., as shown in FIG. 1, a processing chamber 2 formed of, e.g., aluminum in a manner that a depressurization thereof is possible; a mounting table 3 disposed at a central portion of a bottom of the processing chamber 2 to mount thereon an object (wafer W) to be processed; and a plurality of (e.g., nineteen) electron beam tubes 4 concentrically arrayed on a ceiling of the processing chamber 2 facing the mounting table 3. The processing apparatus 1 irradiates an electron beam onto the entire top surface of the wafer W placed on the mounting table 3 from each of the electron beam tubes 4 under the control of a controller (not shown), thereby reforming a film quality of a coated insulating film (referred to as an "SOD (Spin On Dielectric) film" hereinafter) formed on the surface of the wafer W. Such a reforming process using electron beams will be referred to as an EB (electron beam) cure hereinafter, if necessary.

Connected to a bottom surface of the mounting table 3 is an elevating mechanism 5. The mounting table 3 is moved upward and downward via a ball screw 5A of the elevating mechanism 5. The bottom surface of the mounting table 3 and the bottom surface of the processing chamber 2 are connected via an expansible and contractible stainless steal bellows 6, which allows the inside of the processing chamber 2 to be hermetically sealed. Further, provided at a side wall of the processing chamber 2 is a wafer loading/unloading opening 2A. Installed at the wafer loading/unloading opening 2A is a gate value 7 for opening and closing the wafer loading/unloading opening 2A. Further, the processing chamber 2 is provided with a gas supply port 2B disposed above the wafer loading/unloading opening 2A and a gas exhaust port 2C is formed at the bottom surface of the processing chamber 2. Connected to the gas supply port 2B and the gas exhaust port 2C via a gas supply line 8 and a gas exhaust line 10, respectively, are a gas supply source 9 and a vacuum exhaust system (not shown). Installed on the gas supply line 8 are a mass flow controller 11 and a valve 12, through which a source gas is supplied into the processing chamber 2 from the gas supply source 9 while its flow rate is being controlled. Reference numeral 13 in FIG. 1 represents a bellows cover.

Figure 2:
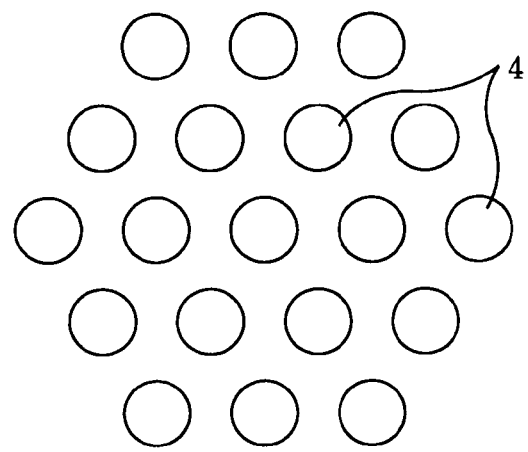
FIG. 2 sets forth a plan view of an exemplary arrangement of electron beam tubes of the electron beam processing apparatus shown in FIG. 1.

The mounting table 3 has a heater 3A on a top surface thereof by which the wafer w is heated up to a desired temperature. The nineteen electron beam tubes 4 are arrayed, e.g., as shown in FIG. 2, where one of the electron beam tubes 4 is disposed at the center of the ceiling of the processing chamber 2; six of them are disposed around the one at the center and the remaining twelve are placed around the six. Each electron beam tube 4 has a transparent window installed inside the processing chamber 2 for transmitting an electron beam, and is hermetically structured. The transparent windows are made of, e.g., transparent quartz glass. Disposed below the transparent windows in a manner of facing thereto are detectors 4A of a grid pattern. The detectors 4A detect doses of electrons colliding therewith and then provide detection signals to the controller. The controller controls the concentrically disposed nineteen electron beam tubes 4 based on the detection signals from the detectors 4A.

Employed as an organic material for forming the SOD film for use in the preferred embodiment is, for example, a low-k material having a dielectric constant lower than that (a value of about 4) of quartz. An organic material including silicon (Si), carbon (C), hydrogen (H) and oxygen (O) can be used as the low-k material. For example, such an organic material can be a polyorganosiloxane cross-linked benzocyclobutene (BCB) resin, a polyallylene ether (PAE) resin such as FLARE (a trade mark) and SiLK (a trade mark) manufactured by the Dow Chemical Company, and an organic polysiloxane resin such as methyl silsesquioxane (MSQ). An example of the MSQ-based organic material is LKD manufactured by JSR Corporation. If electron beams are irradiated onto the SOD film, organic compounds included therein are activated and, as a result, there occurs a cleavage of a chemical binding thereof, thereby generating, e.g., hydrocarbon radicals such as methyl radicals. Such cleavage reaction is continued until a chemical equilibrium is obtained. In the preferred embodiment, a low molecular weight hydrocarbon-based gas, to be described later in detail, is employed in order to suppress the release of methyl groups from the surface of the SOD film due to the cleavage reaction.

Any low molecular weight hydrocarbon-based gas can be employed as long as it can generate hydrocarbon radicals such as methyl or ethyl radicals after being converted into a plasma inside the processing chamber 2 by the irradiation of the electron beams, thereby suppressing generation of, e.g., hydrocarbon radicals from the organic material film. As such a low molecular weight hydrocarbon-based gas, a hydrocarbon gas having not greater than 3 carbon atoms, e.g., methane, ethane or propane, is preferably employed, and, further, a low molecular weight hydrocarbon gas with a substituent such as halogen can also be used. Furthermore, a silicon compound having alkyl groups such as hexamethyldisilazane (HMDS) can be employed as well. The hydrocarbon radicals generated by the irradiation of the electron beams can serve to suppress the release of hydrocarbon groups such as methyl groups from the surface of the SOD film. Consequently, a reduction of a contact angle on the SOD film is restrained while enhancing a chemical resistance thereof and suppressing an increase of a k value.

In the following, there will be described the preferred embodiment of an electron beam processing method using the electron beam processing apparatus 1 in accordance with the present invention. The method suppresses a decrease in a contact angle on a surface of an SOD film and a deterioration of a k value by reforming the SOD film formed on, e.g., a wiring film layer on a surface of a wafer W.

First, the wafer W having the SOD film coated thereon is transferred to the electron beam processing apparatus 1 via an arm of a conveying mechanism (not shown). Then, the gate valve 7 is opened to allow the arm of the conveying mechanism to transfer the wafer W into the processing chamber 2 through the wafer loading/unloading opening 2A and then to load the wafer W on the mounting table 3 standing by in the processing chamber 2. Subsequently, the arm of the conveying mechanism is withdrawn from the processing chamber 2 and the gate value 7 is closed to hermetically seal the processing chamber 2. In the meanwhile, the mounting table 3 is elevated by the elevating mechanism 5, so that a predetermined distance is maintained between the wafer W and the electron beam tubes 4.

Thereafter, the processing chamber 2 is evacuated by the vacuum exhaust system and, at the same time, a low molecular weight hydrocarbon-based gas (e.g., methane gas) is introduced into the processing chamber 2 from the gas supply source 9, so that the air inside the processing chamber 2 is substituted with the methane gas, and the pressure thereof in the processing chamber 2 is maintained at a predetermined level. At this time, the heater 3A of the mounting table 3 starts heating the wafer W to set the temperature thereof at a predetermined level. At this stage, a predetermined voltage is applied to all of the electron beam tubes 4 to enable electron beams therefrom to be irradiated onto the SOD film on the surface of the wafer W.

While traveling toward the surface of the wafer W, some of the electron beams serve to convert the methane gas into a plasma and generate methyl radicals. Further, the rest of the electron beams that directly arrive at the wafer W give an activation energy to, e.g., MSQ forming the SOD film, thereby hardening the SOD film by contracting the MSQ through, e.g., a cross-linking reaction and at the same time partially cleaving the MSQ at the surface of the SOD film to thereby generate methyl radicals therefrom. Since, however, methyl radicals generated from the methane gas are already included in the processing chamber 2, the release of the methyl radicals from the surface of the SOD film can be suppressed, thereby preventing a reduction in a hydrophobic property of the surface of the SOD film and, also, suppressing a degradation of a chemical resistance such as a resistance to a cleaning solution. Moreover, the electron beams do not deteriorate an apparent k value of the SOD film even when they are directly irradiated thereon as descried above.

A partial pressure of the methane gas in the processing chamber 2 is preferably set to be equal to or higher than, e.g., 0.01 Torr and, more preferably, from about 0.1 to 1 Torr. If the partial pressure of the methane gas is below 0.01 Torr, it becomes easier for the electron beams to transmit the methane gas. That is, converting the methane gas into the plasma by the electron beams becomes difficult in such a case, thereby resulting in a deterioration of the k value of the SOD film layer. Further, if the partial pressure of the methane gas is excessively high, it is likely that the electron beams collide with the methane gas, thereby resulting in energy losses thereof. Accordingly, the number of electron beams arriving at the wafer W is reduced, thereby hampering an efficient ED cure of the SOD film. Furthermore, it is preferable that a heating temperature of the wafer W be maintained at, e.g., about 200 to 400° C. If the temperature of the wafer W is excessively low, a sufficient EB cure cannot be performed and, as a result, sufficient film strength cannot be obtained. Moreover, if the temperature of the wafer W is too high, it is likely that the k value of the SOD film is deteriorated.

In the preferred embodiment as described above, since the electron beams are irradiated onto the SOD film on the surface of the wafer W in an atmosphere of the methane gas, the methyl radicals are generated from the methane gas by the irradiation of the electron beams. The thus generated methyl radicals function to prevent reduction of the chemical resistance of the SOD film by suppressing the release of the methyl groups from the SOD film. Further, by the irradiation of the electron beams onto the SOD film, the EB cure of the SOD film can be carried out.

Moreover, since the partial pressure of the methane gas is set to be not lower than 0.01 Torr in accordance with the preferred embodiment of the present invention, the deterioration of the k value of the SOD film or the degradation of the chemical resistance thereof can be more effectively suppressed. In addition, by using the MSQ as the SOD film and the methane gas as the hydrocarbon gas, the release of the methyl groups from the SOD film can be more effectively suppressed.

Next, there will be described specific examples of the preferred embodiment of the present invention with reference to FIGS. 3 to 5B. In the examples, electron beam tubes having transparent windows made of transparent quartz glass in a thickness of 3 μm were employed and a distance between the transparent quartz glass and a wafer was set to be 75 mm.

Example 1

Figure 3:
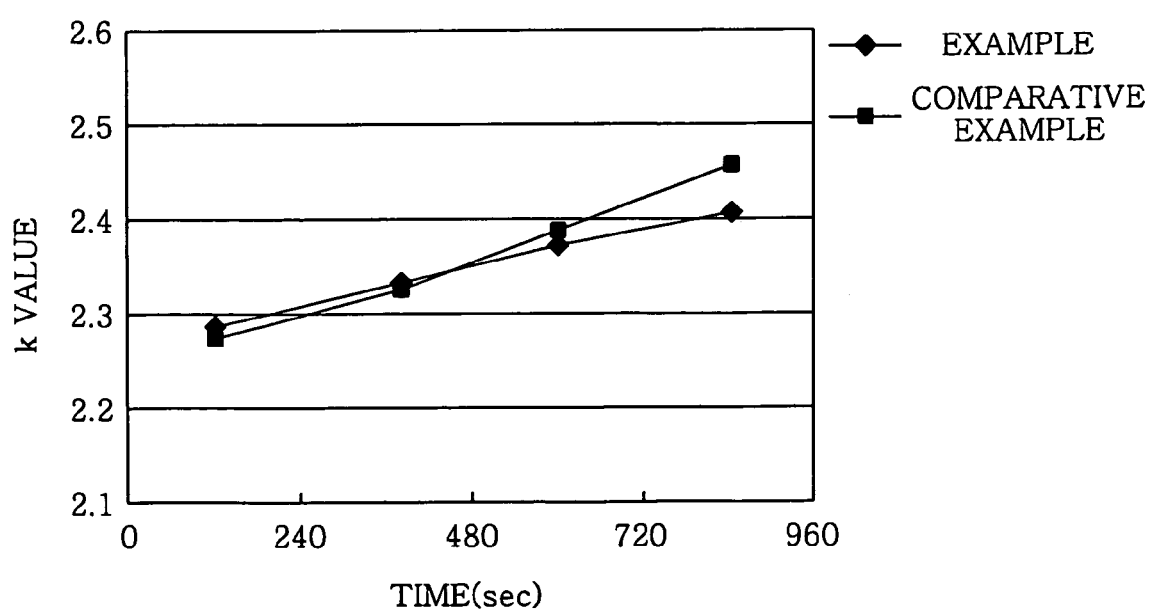
FIG. 3 depicts a graph of measurement results of a first example of the electron beam processing method in accordance with the present invention and a first comparative example, which represents a relationship between an irradiation time of electron beams and a k value.
Figure 4A:
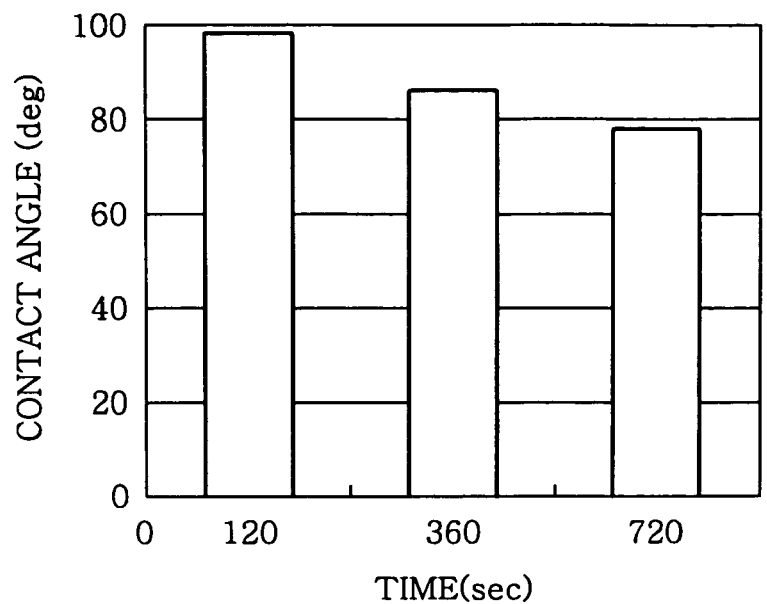
FIG. 4A exhibits a relationship between an irradiation time of electron beams and a contact angle for the first example of the electron beam processing method in accordance with the present invention.

In this example, a wafer W on which an MSQ-based SOD film was coated with a thickness of 5000 angstroms was prepared. Then, the wafer W was processed in an atmosphere of the methane gas under the processing condition as specified below by employing the electron beam processing apparatus 1. Then, by conducting sampling every two minutes, a k value and a contact angle of the SOD film were measured and a relationship between the processing time and the k value of SOD film and that between the processing time and the contact angle on the surface of the SOD film were investigated. FIGS. 3 and 4A show the measurement results thereof. Further, the SOD film was formed of LKD5109 (manufactured by JSR Corporation).

[Processing Condition]
Applied voltage: 21 kV
Applied current: 250 μA
Flow rate of methane gas: 100 sccm (partial pressure thereof=0.34 Torr)
Flow rate of Ar gas: 2900 sccm
Pressure of gas: 10 Torr
Temperature of the wafer: 350° C.

Comparative Example 1

Figure 4B:
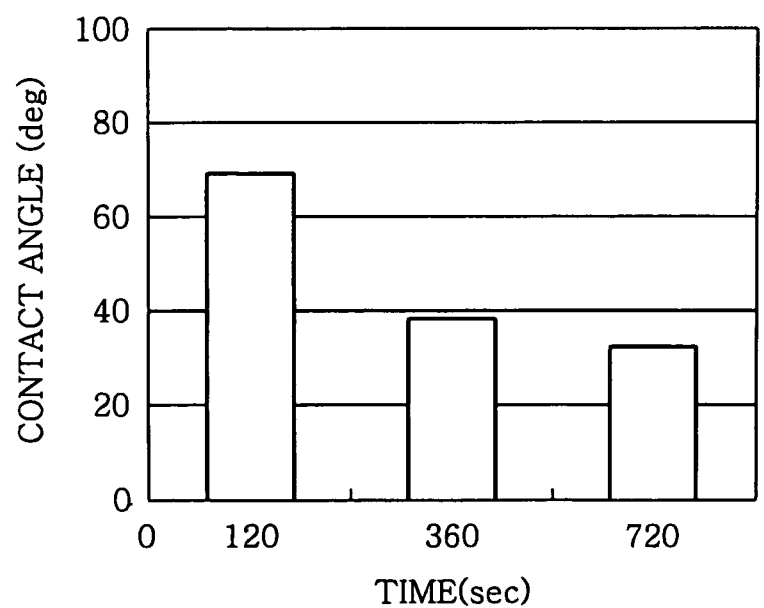
FIG. 4B provides a relationship between an irradiation time of electron beams and a contact angle for the first comparative example.

Herein, a wafer was processed under the same processing condition described in Example 1, excepting that only an Ar gas was employed in lieu of the methane gas. As in Example 1, a relationship between the processing time and the k value of SOD film and that between the processing time and the contact angle on the surface of the SOD film were investigated. FIGS. 3 and 4B show the measurement results thereof.

From the results shown in FIG. 3, it was found that k values in Example 1 using the methane gas were lower than those in Comparative Example 1 using the AR gas if the processing time was longer than about 480 seconds, indicating that the degradation of the k values was suppressed. Furthermore, from the results shown in FIGS. 4A and 4B, a decremental rate of contact angles was found to be smaller in Example 1 using the methane gas than in Comparative Example 1 using the AR gas. From the above, it can be seen that, by performing the EB cure on the SOD film in the atmosphere of the methane gas, the release of methyl groups from the surface of the SOD film can be suppressed, so that a chemical resistance such as a resistance to a cleaning solution of the SOD film can be prevented from being reduced without deteriorating the k value.

Example 2

In this example, changes in content ratio of methyl groups on the surface of SOD film were observed by varying thicknesses of the SOD films. Two types of wafers were prepared: one having thereon an MSQ-based SOD film coated in a thickness of 5000 angstroms and the other having an MSQ-based SOD film coated in a thickness of 1000 angstroms. Then, the wafers were processed under the same processing condition as described in Example 1, and amounts of absorption of infrared rays of Si—$CH_3$ and Si—O of the SOD films were measured by fourier transform infrared (FT-IR) spectroscopy by performing sampling at two minute intervals. Ratios of Si—$CH_3$/Si—O were calculated from the amounts of absorption and the ratios were regarded as the content ratios of methyl groups. The results are provided in FIG. 5A.

Comparative Example 2

Two types of wafers as described in Example 2 were processed under the same processing condition as in Comparative Example 1. Then, content ratios of methyl groups were calculated as in Example 2, and the results are provided in FIG. 5B.

Figure 5A:
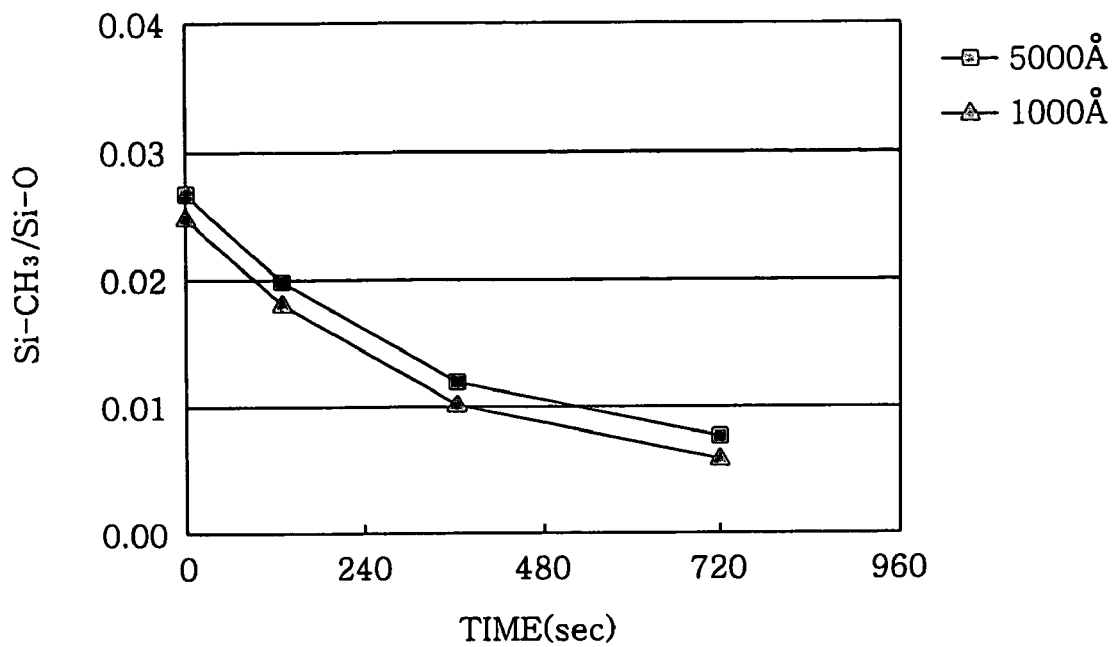
FIG. 5A describes a relationship between an irradiation time of electron beams and a content ratio of methyl groups for a second example of the electron beam processing method in accordance with the present invention.
Figure 5B:
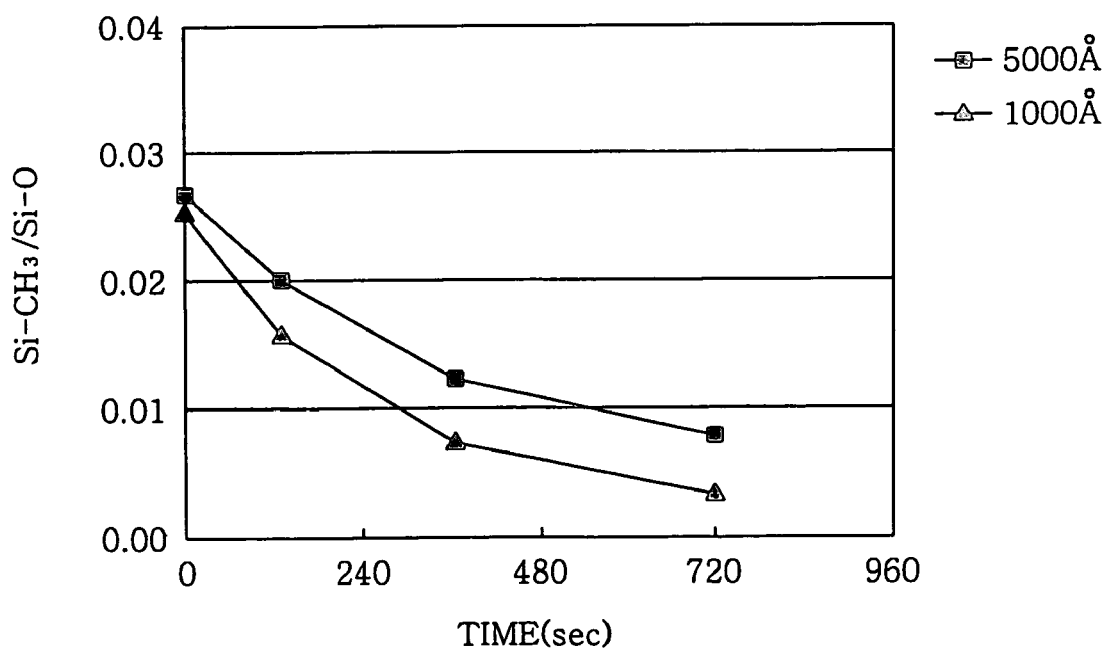
FIG. 5B illustrates a relationship between an irradiation time of electron beams and a content ratio of methyl groups for a second comparative example.

As can be seen from the results in FIGS. 5A and 5B, in case of the SOD films having the thickness of 5000 angstroms, the content ratio of methyl groups decreases in a similar manner in Example 2 and Comparative Example 2, exhibiting no noticeable effect of the methane gas employed in Example 2. On the other hand, the results of the SOD films having a ⅕ of thickness, i.e., 1000 angstroms, show that a decremental rate in Example 2 using the methane gas is smaller than that in Comparative Example 2 using the Ar gas, indicating that methyl groups in the plasma of the methane gas serve to reduce an amount of methyl groups released from the SOD film. The effect of the methane gas may not be observed from a thick SOD film because the FT-IR measurement data can not exactly reflect changes in the content ratio of the methyl groups in a surface region of the SOD film, even in a case there exist such changes. That is, since the FT-IR measures an amount of infrared rays absorbed by the entire thickness of an SOD film, variations of the content ratio of methyl groups in the surface region of a thick SOD film may not be detected by the FT-IR due to a relatively higher content ratio of methyl groups in the bulk region thereof.

The present invention is not limited to the preferred embodiment described above but can be modified in various ways. For example, the gas supplied into the processing chamber is not limited to the methane gas but can be any one of low molecular weight hydrocarbon-based gases as long as hydrocarbon radicals can be generated therefrom. Such low molecular weight hydrocarbon-based gas can be, e.g., ethane, propane or a low molecular weight hydrocarbon gas having a substituent such as halogen. Moreover, a silicon compound having alkyl groups such as hexamethyldisilazane (HMDS) can also be employed instead of the methane gas. Further, though the preferred embodiment has been described for the case of performing a curing process on a wafer having thereon a coated insulating film (SOD film) by using the methane gas, the preferred embodiment can also be applied to a film formed by CVD. In addition, by irradiating electron beams onto an object to be processed through the gas described above, an organic film can be formed on a surface of an object to be processed.

While the invention has been shown and described with respect to the preferred embodiments, it will be understood by those skilled in the art that various changes and modifications may be made without departing from the spirit and scope of the invention as defined in the following claims.

What is claimed is:

1. An electron beam processing method for processing an organic material film formed on a surface of an object to be processed by using an electron beam,
wherein the electron beam is irradiated onto the organic material film through a hydrocarbon radical generating gas, a partial pressure of which is greater than or equal to 0.1 Torr.

2. The method of claim 1, wherein the hydrocarbon radical generating gas is a low molecular weight hydrocarbon-based gas.

3. The method of claim 2, wherein the low molecular weight hydrocarbon-based gas is a methane gas.

4. The method of claim 1, wherein the organic material film has a low dielectric constant.

5. The method of claim 1, wherein the organic material film is made of an organic silicon compound.

6. An electron beam processing apparatus comprising:
a hermetically structured processing chamber;
a mounting table disposed inside the processing chamber for mounting thereon an object to be processed having an organic material film formed on a surface thereof;
a plurality of electron beam tubes disposed above the mounting table;
a gas supply unit for supplying a hydrocarbon radical generating gas into the processing chamber; and
a depressurization unit for reducing an inner pressure of the processing chamber,
wherein the electron beam tubes irradiate electron beams onto the organic material film through the hydrocarbon radical generating gas, and
wherein a partial pressure of the hydrocarbon radical generating gas is set to be greater than or equal to 0.1 Torr.

7. The apparatus of claim 6, wherein the hydrocarbon radical generating gas is a low molecular weight hydrocarbon-based gas.

8. The apparatus of claim 7, wherein the low molecular weight hydrocarbon-based gas is a methane gas.

9. The apparatus of claim 6, wherein the organic material film has a low dielectric constant.

10. The apparatus of claim 6, wherein the organic material film is made of an organic silicon compound.

* * * * *